United States Patent
Betts

(10) Patent No.: US 7,055,088 B2
(45) Date of Patent: May 30, 2006

(54) INTERLEAVED GENERALIZED CONVOLUTIONAL ENCODER

(75) Inventor: William L. Betts, St. Petersburg, FL (US)

(73) Assignee: Paradyne Corporation, Largo, FL (US)

( * ) Notice: Subject to any disclaimer, the term of this patent is extended or adjusted under 35 U.S.C. 154(b) by 866 days.

(21) Appl. No.: 09/777,213

(22) Filed: Feb. 5, 2001

(65) Prior Publication Data

US 2001/0036232 A1 Nov. 1, 2001

Related U.S. Application Data

(60) Provisional application No. 60/228,019, filed on Aug. 24, 2000, provisional application No. 60/181,994, filed on Feb. 11, 2000, provisional application No. 60/181,907, filed on Feb. 11, 2000.

(51) Int. Cl.
*H03M 13/03* (2006.01)

(52) U.S. Cl. .................................. 714/788; 714/774
(58) Field of Classification Search ................ 714/774, 714/786, 787, 788
See application file for complete search history.

(56) References Cited

U.S. PATENT DOCUMENTS

| | | | | |
|---|---|---|---|---|
| 4,545,054 A | * | 10/1985 | Davis .......................... | 714/795 |
| 4,677,624 A | | 6/1987 | Betts et al. ................... | 714/792 |
| 4,677,625 A | | 6/1987 | Betts et al. ................... | 714/792 |
| 4,677,626 A | | 6/1987 | Betts et al. ................... | 714/792 |
| 4,901,319 A | * | 2/1990 | Ross .......................... | 714/788 |
| 5,243,627 A | | 9/1993 | Betts et al. ................... | 375/222 |
| 5,559,835 A | | 9/1996 | Betts .......................... | 375/265 |
| 5,912,898 A | * | 6/1999 | Khoury ....................... | 714/701 |
| 5,996,104 A | * | 11/1999 | Herzberg ..................... | 714/755 |
| 6,118,825 A | * | 9/2000 | Ikeda et al. .................. | 375/259 |
| 6,223,324 B1 | * | 4/2001 | Sinha et al. .................. | 714/776 |

OTHER PUBLICATIONS

International Telecommunication Union, ITU-T, Telecommunication Standardization Sector of ITU, Draft G.shdsl, Transmission of Systems and Media, "Single-Pair High Speed Digital Subscriber Line (SHDSL) Transceivers".

ITU—Telecommunication Standardization Sector, Study Period 1997-2000, Study Group 15, Delayed Contribution D.xxx, Geneva, Apr. 3-14, 2000, Text available only in E, Question: 4/15, Source: Paradyne Corporation, Title: "G.shdsl: 4-Wire Space Diversity Convolutional Encoding".

ITU—Telecommunication Standardization Sector, Study Period 1997-2000, Study Group 15, Delayed Contribution D.726(WP1/15), Geneva, Apr. 3-14, 2000, Text available only in E, Question: 4/15, Source: Paradyne Corporation, Title: "G.991.2 (ex G.shdsl): Interleaved convolutional encoder".

(Continued)

*Primary Examiner*—Joseph D. Torres
(74) *Attorney, Agent, or Firm*—Thomas, Kayden, Horstemeyer & Risley, LLP

(57) ABSTRACT

Several embodiments of an interleaved generalized convolutional encoder system and method are provided for communicating data over a transmission path in order to inhibit distortion caused by impulse noise or other correlated noise and enhance transmission rate of data communications. The encoder system is designed to introduce a variable delay to the convolutional encoder. The variable delay effectively spreads correlated noise over a variable number of symbols in time. Correlated noise that is spread over time allows for better error correction encoding.

24 Claims, 10 Drawing Sheets

OTHER PUBLICATIONS

Entitled "Space Diversity Trellis Interleaver System And Method", U.S. Appl. No. 09/534,696, filed on Mar. 24, 2000.
Entitled "Discrete Multitone Interleaver", U.S. Appl. No. 09/736,353, filed on Dec. 14, 2000.

International Telecommunication Union, ITU-T, Telecommunication Standardization Sector of ITU, Study Group 15—Contribution 3, New Draft Recommendation G.991.2—Single-Pair High Speed Digital Subscriber Line (SHDSL) Transceivers—For Approval, Oct. 2000.

* cited by examiner

Convolutional Encoder
(Prior Art)

Interleaved Generalized Convolutional Encoder
(First Embodiment)

FIG. 7

Activation Frame Format (Prior Art)

| Activation Frame Bit LSB:MSB | Definition |
|---|---|
| 1:14 | Frame Sync for $T_c$ and $T_r$: $11111001101011_2$, where the left-most bit is sent first in time |
| 15:36 | Frame Sync for $F_c$: $1111100110101011_2$, where the left-most bit is sent first in time |
| 37:58 | Precoder Coefficient 1: 22 bit signed two's complement format with 17 bits after the binary point, where the LSB is sent first in time. |
| 59:3952 | Precoder Coefficient 2 |
| 3953:3974 | Precoder Coefficients 3 – 179 |
| 3975:3995 | Precoder Coefficient 180 |
| 3996:4016 | Encoder Coefficient A: 21 bits where the LSB is sent first in time |
| 4017:4144 | Encoder Coefficient B: 21 bits where the LSB is sent first in time |
| 4145:4211 | Vendor Data: 128 bits of proprietary information |
| 4212:4227 | Reserved: 67 bits set to logical zeros |
| | CRC: $c_1$ sent first in time, $c_{15}$ sent last in time |

FIG. 8

Interleaved Generalized Convolutional Encoder Activation Frame Format

| Activation Frame Bit LSB:MSB | Definition |
|---|---|
| 1:14 | Frame Sync for $T_c$ and $T_r$: $11111001101011_2$, where the left-most bit is sent first in time |
| 15:36 | Frame Sync for $F_c$: $1111100110101011_2$, where the left-most bit is sent first in time |
|  | Precoder Coefficient 1: 22 bit signed two's complement format with 17 bits after the binary point, where the LSB is sent first in time. |
| 37:58 | Precoder Coefficient 2 |
| 59:3952 | Precoder Coefficient 3 –179 |
| 3953:3974 | Precoder Coefficient 180 |
| 3975:3995 | Encoder Coefficient A: 21 bits where the LSB is sent first in time |
| 3996:4016 | Encoder Coefficient B: 21 bits where the LSB is sent first in time |
| 4017:4024 | Multiplicity of Convolution Encoders, M: 8 bits where the LSB is sent first in time |
| 4025:4152 | Vendor Data: 128 bits of proprietary information |
| 4153:4211 | Reserved: 59 bits set to logical zeros |
| 4212:4227 | CRC: $c_1$ sent first in time, $c_{15}$ sent last in time |

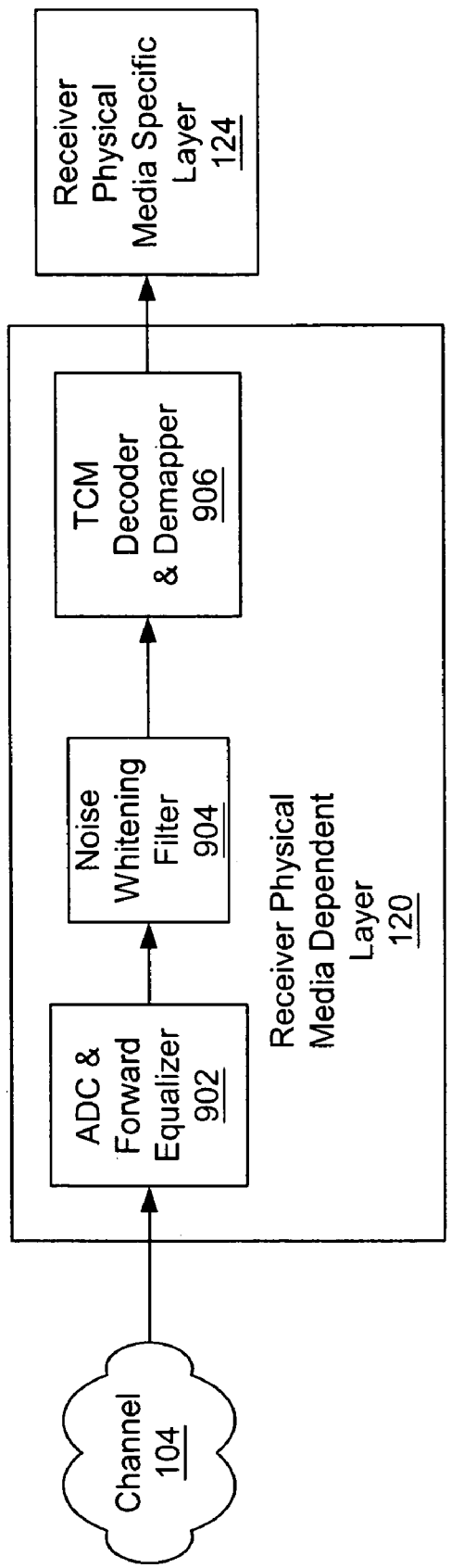

INTERLEAVED GENERALIZED CONVOLUTIONAL ENCODER

CROSS-REFERENCE TO RELATED APPLICATIONS

This application claims priority to now abandoned U.S. provisional applications: (a) "4-Wire Modulation Within the physical media dependent Layer," having Ser. No. 60/181,907, filed Feb. 11, 2000 (Paradyne Docket No. 2000-06); (b) "Space Diversity Trellis Interleaver," having Ser. No. 60/181,994, filed Feb. 11, 2000 (Paradyne Docket No. 1997-64); and (c) "4-Wire Modulation Within the physical media dependent Layer," having Ser. No. 60/228,019, filed Aug. 24, 2000 (Paradyne Docket No. 2000-06). All identified now abandoned U.S. provisional applications are incorporated herein by reference.

TECHNICAL FIELD

The present invention generally relates to communications and modems, and more particularly to an interleaved generalized convolutional encoder system and method for efficiently minimizing noise distortion and enhancing data transmission communications.

BACKGROUND OF THE INVENTION

Communications devices, particularly those that implement digital subscriber line (DSL) technologies (e.g., T1 and xDSL, including SDSL, HDSL, HDSL2, SHDSL, ADSL, G.shdsl, etc.), transmit high-speed data using analog signals over telephone connections, which are typically copper wire pairs. The transmission of high-speed data over copper wires may be impaired by impulse noise in the transmission path. Coding of data is used to minimize the adverse affects of impulse noise.

Impulse noise can originate from many sources. For example, Plain Old Telephone Service (POTS) ringers introduce broadband Near End Cross Talk (NEXT) impulses. Drop or entrance cable and premises wiring are large contributors to impulse noise. Impulse noise events are likely correlated over several symbol (or baud) periods of the DSL modulation. Such correlated noise can corrupt several consecutive symbols. Correlated noise may also be due to transient disturbances such as gain or timing phase changes in the channel. The corruption from transient disturbances may last until corrected by automatic gain control or timing acquisition circuits in the receiver.

Coding in Single-pair High-bit-rate DSL (SHDSL) and High-bit-rate Digital Subscriber Line 2 (HDSL2) may be accomplished with convolutional encoders and precoders. Convolutional encoders are used to implement Forward Error Correction (FEC) coding techniques (also known as convolutional coding). Typically, in forward error correction coding the transmitter encodes data by adding redundant bits systematically to the data bits so that, normally, only predetermined transitions from one sequential group of bits (corresponding to a symbol, or baud) to another are allowed. There is an inherent correlation between these redundant bits over consecutive symbols. At the receiver, each symbol is tentatively decoded and then analyzed based on past history, and the decoded bits are corrected, if necessary.

One well-known and widely accepted error coding technique is Trellis Coded Modulation (TCM), which is a form of convolutional coding that is optimized according to a specific modulation scheme. A TCM encoder is situated at the transmitter, and a TCM decoder is situated at the receiver. TCM is highly desirable since it combines the operations of modulation and error coding to provide effective error control coding without sacrificing power and bandwidth efficiency. TCM essentially averages the noise over more than one of the symbols. However, noise that is correlated over the constraint length of the trellis code will degrade performance of the decoder. In many cases, correlated noise causes the trellis decoder to perform worse than if the receiver employed no trellis coding at all.

In addition to the TCM encoder, precoders are designed to compensate for some correlated noise in the signal path. However, precoders can also break down if the impulse noise is correlated over several symbol periods. The correlated noise may be due to linear distortion in the transmit path of the noise source. The precoder may be of little benefit for linear distortion in the transmit path.

One method of addressing correlated noise problems is to interleave symbols. However, the generalized convolutional encoders employed with SHDSL and HDSL2 have limited interleaving capability. Thus, a need exists in the industry to overcome the aforementioned deficiencies and inadequacies.

The various DSL technologies employ a variety of line coding, e.g. 2 Binary, 1 Quaternary (2B1Q), Quadrature Amplitude and Phase modulation (QAM), Carrierless Amplitude and Phase (CAP) modulation, and Discrete Multitone (DMT). SHDSL and HDSL2 use Pulse Amplitude Modulation (PAM) coding to produce signals to be transported from transmitter to receiver.

As examples of the prior art described above, U.S. Pat. No. 5,659,578 to Alamouti et al., and U.S. Pat. No. 4,677,625 to Betts et al., describe the concept of TCM. The '625 Patent describes a distributed trellis encoder that can be used to spread symbols associated with a data stream over time across successive symbol periods, i.e. interleaving. The '625 Patent employs a plurality of trellis encoders to interleave the symbols. In addition, the ITU (International Telecommunication Union) has compiled a draft specification titled "G.991.2 (ex G.shdsl)—Single-Pair High Speed Digital Subscriber Line (SHDSL) Transceivers" (G.991.2). G.991.2 (ex G.shdsl) is available from the ITU, Geneva, Switzerland, at http://www.itu.int. Draft G.shdsl describes a system and method for providing SHDSL service. U.S. Pat. No. 5,659,578; U.S. Pat. No. 4,677,625; and G.991.2 are incorporated herein by reference.

DSL technologies are still in a state of infancy and are being improved over time by engineers and designers. The industry still needs ways to further enhance DSL communications and, in particular, ways to minimize the adverse effects of impulse noise. Thus, a heretofore unaddressed need exists in the industry to address the aforementioned deficiencies and inadequacies.

SUMMARY OF THE INVENTION

The present invention provides a system and method for data transport in telecommunications access networks including an interleaved generalized convolutional encoder. More particularly, the present invention provides a system and method for error correction coding in telecommunications equipment. Error correction minimizes noise distortion and enhances the data rate of transmission. The system involves interleaving data segments between a plurality of data symbols separated in time. By interleaving the date segments, effects of noise on the transmission system are spread out in time. If the effects of noise are spread out in time, error correction coding has a better chance of detecting and correcting transmission anomalies.

Briefly described, in architecture, the interleaved generalized convolutional encoder system can be implemented as follows. A transmitter is designed to receive a plurality of data streams from data terminal equipment (DTE), which can be one or more devices. The transmitter converts and processes the plurality of data streams into data symbols. The data symbols are passed on to the transmitter's interleaved generalized convolutional encoder, a trellis encoder in the preferred embodiment. The interleaved generalized convolutional encoder encodes the DTE inputs and interleaves data segments between data symbols separated in time. In the preferred embodiment, the separation in time is accomplished through a plurality of dynamically controlled variable unit delaying elements between each node of the convolutional encoder. The interleaved generalized convolutional encoder also employs logic calculators and input from a receiver to produce the output of the encoder. Each unit delay element is equal to one symbol time. "Variable" refers to the ability to change the delay. "Dynamically" refers to the ability to set the delay based on the noise encountered in the system during transmission. The plurality of interleaved and convolutionally encoded data symbols are modulated and transmitted on one or more communication paths.

Interleaving spreads the TCM symbols over multiple symbol periods. The additional unit delay elements between each node can be understood as effectively implementing multiple convolutional encoders that operate sequentially. However, only one encoder, with additional unit delay elements, is necessary to practice the invention. Under this paradigm, the TCM symbols sent to each encoder are separated by the number of additional symbol unit delays added between each node of the new convolutional encoder.

At a receiving unit, the plurality of data symbols are received from the one or more communication paths and demodulated, de-interleaved and convolutionally decoded. The convolutional decoders are preferably trellis decoders. De-interleaving in the receiver will reorder the received TCM symbols into their original sequence. The de-interleaving operation will advantageously spread out consecutive symbols that were disturbed by the impulse or transient event. The de-interleaved convolutionally decoded data symbols are incorporated into a data stream that is sent to one or more application interfaces.

In the case of a TCM encoder, a metric calculated every symbol time is stored in a memory buffer with cells equal to the number of delay elements inserted between each node of the new convolutional encoder. If a trace back path is used, then there will be the same number of path memories, each used sequentially in time. This effectively implements decoders equal in number to the additional unit delays.

In accordance with another embodiment of the present invention, the time delayed interleaved generalized convolutional encoder system can be employed by modifying coefficients provided to the transmitting unit by the receiving unit. SHDSL employs 21 coefficients to define the prior art convolutional encoder. If less than half the coefficients are used, a second interleaved encoder can be implemented by modifying the coefficients by inserting a number of zero coefficients between every coefficient of the prior art encoder. The number of zeros inserted is equal to the number of new interleaved encoders implemented by this embodiment.

The present invention can also be viewed as providing several novel methods for enhancing data communication. Broadly summarized, one such method, for implementation in connection with a transmitter, can be stated as follows: receiving a plurality of data streams; converting the data streams into data symbols; convolutionally encoding each of the data symbols; interleaving the data symbols between data symbols separated in time; and transmitting the interleaved convolutionally-encoded data symbols on one or more communication paths. The encoding and interleaving of the current invention can be done at the same time. Another such method, for implementation in connection with a receiver, can be stated as follows: receiving a plurality of data symbols from one or more communication paths; de-interleaving data symbols; and convolutionally decoding each of the de-interleaved data symbols.

Other systems, methods, features, and advantages of the present invention will be apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 7 is a table showing a prior art activation frame format for conveying parameters for the prior art convolutional encoder of FIG. 4.

FIG. 8 is a table showing an interleaved generalized convolutional encoder activation frame format for conveying the parameter associated with the variable unit time delay of FIG. 6.

FIG. 9 is a block diagram of the physical media dependent layer of the receiver of the DSL transmission system of FIG. 1 including a TCM decoder and demapper.

DETAILED DESCRIPTION

Figure 1:
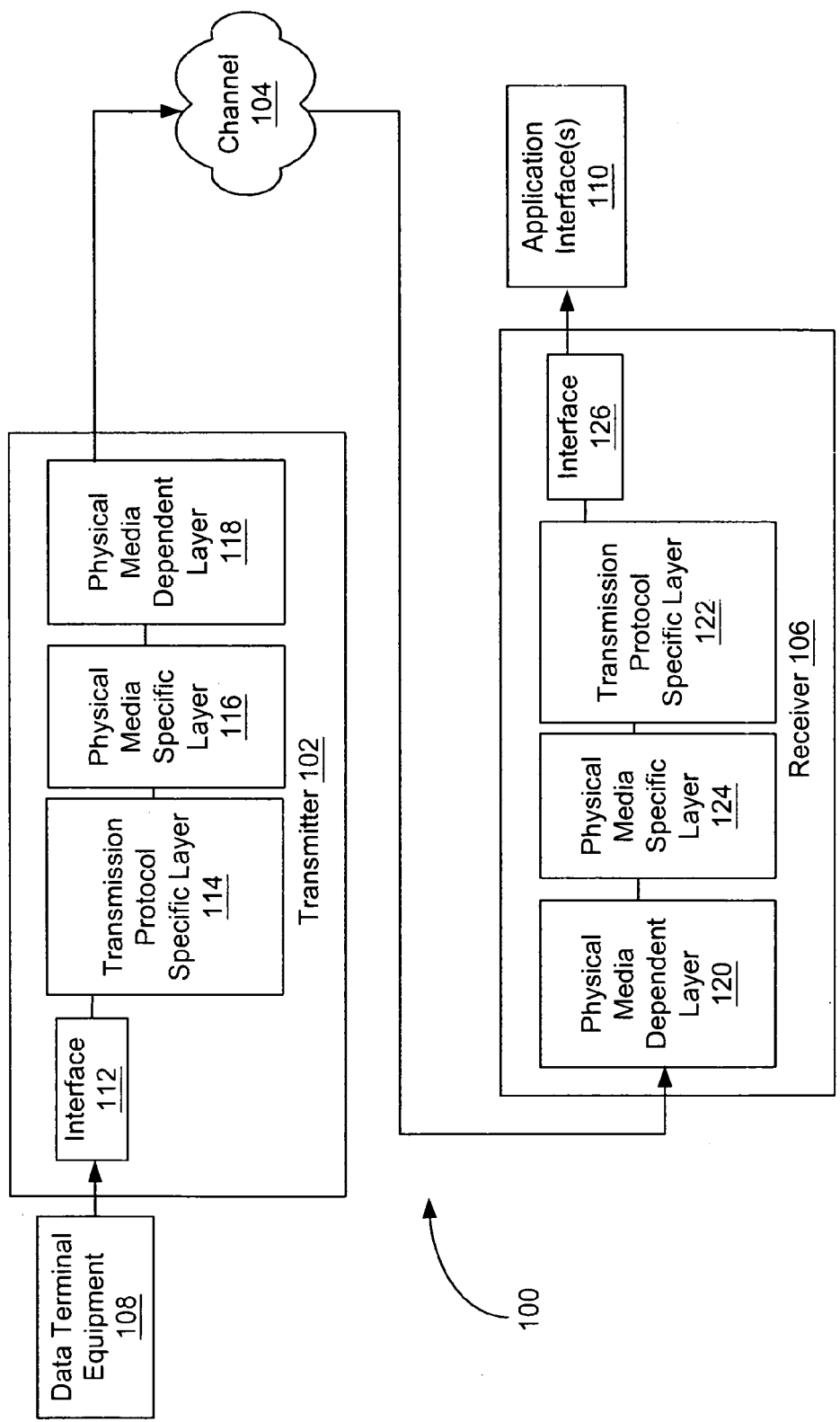
FIG. 1 is a block diagram of a single-pair high-bit-rate Digital Subscriber Line (DSL) transmission system including separate physical media dependent layers associated with a transmitter and a receiver.

The interleaved generalized convolutional encoder system (and associated method(s)) of the present invention will be specifically described hereafter in the context of three embodiments of a transmitter and one embodiment of a receiver. The embodiments are intended to be possible nonexclusive examples of implementations. Numerous other embodiments are envisioned and are possible, as will be apparent to those with skill in the art.

The interleaved generalized convolutional encoder system of the present invention allows trellis coding over multiple symbol periods. Although not limited to this particular application, the interleaved generalized convolutional encoder system is particularly suited for use in connection with modems at opposing ends of a telephone connection (wire pair) extending between a central office (CO; defined as any facility having a telephone switch) associated with a telephone company and a customer premises (CP). The modems can employ any suitable modulation scheme, for example but not limited to, that prescribed by the industry standard V.34 that has been promulgated by the International Telecommunications Union (ITU).

The interleaved generalized convolutional encoder system can effectively average the noise over multiple symbol periods yielding better performance and longer DSL reach between the CO and CP equipment. The interleaved generalized convolutional encoder allows for dynamic determination of the number of symbol periods over which noise will be averaged. Although not limited to a particular number, it is anticipated that the noise will often be averaged over three symbol periods. In some cases, the interleaved generalized convolutional encoder system provides data throughput where none was possible otherwise.

Note that in the preferred embodiments, as described hereafter, the transmitters and receivers can be implemented in hardware, software, firmware, or a combination thereof. Preferably, all of the component parts of each, except the amplifier and transformer elements, are implemented in firmware that is stored in a memory (EPROM) and that is executed by a suitable instruction execution system, particularly, a digital signal processor (DSP) or general purpose microprocessor. The software/firmware can be stored and transported on any computer readable medium. If implemented in hardware, in whole or in part, as in alternative embodiments, the hardware components can be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Any process descriptions or blocks in figures should be understood as representing modules, segments, or portions of code which include one or more executable instructions for implementing specific logical functions or steps in the process, and alternate implementations are included within the scope of the preferred embodiment of the present invention in which functions may be executed out of order from that shown or discussed, including substantially concurrently or in reverse order, depending on the functionality involved, as would be understood by those reasonably skilled in the art of the present invention.

The interleaved generalized convolutional encoder program, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

I. FIRST EMBODIMENT OF THE INTERLEAVED GENERALIZED CONVOLUTIONAL ENCODER

FIG. 1 is a block diagram of a single-pair high-bit-rate Digital Subscriber Line (DSL) transmission system including separate physical media dependent layers associated with a transmitter and a receiver. FIG. 1 shows a block diagram of a DSL transmission system 100 showing basic functional blocks and interfaces. The transmission system 100 includes a transmitter 102, a channel 104, and a receiver 106. Transmission system 100 shows a transmission system and a method for data transport. Remote power feeding, which may be provided by the receiver 106, is not illustrated.

In the transmission system 100, it is assumed the transmitter 102 is housed in a modem located at a customer's premise and the receiver 106 is housed in a DSL access multiplexer located at a telephone company's central office or a remote location. As is known in the art, the receiver 106 acts as a master to some functions of the transmitter 102 and to any regenerators that may be in the channel 104. In a typical application, transmitter and receiver components will be incorporated into the same device so that the device is capable of transmitting and receiving data. The transmitter 102 and receiver 106 are shown on different ends of the channel 104 in FIG. 1 to more clearly show the interleaved generalized convolutional encoder.

Data terminal equipment 108 provides an input to the transmitter 102. The transmitter 102 processes the input for transmission to the receiver 106 via the channel 104. The receiver 106 de-processes the signal and passes the signal to the application interface 110. The transmitter 102, receiver 106 and the channel 104 (including any regenerators) make up the DSL transmission system 100.

The data terminal equipment 108 can be one or more modems, computer terminals, Internet access devices, televisions, data terminals, subtended telecommunications equipment, or any other wired communication device.

The transmitter 102 includes an interface 112, a transmission protocol specific layer 114, a physical media specific layer 116, and a physical media dependent layer 118. The interface 112 and the transmission protocol specific layer 114 make up an application specific section of the transmitter 102. The user can modify the application specific section to some extent without affecting transmission. The physical media specific layer 116 and the physical media dependent layer 118 are largely standardized.

The transmission protocol specific layer 114 consists largely of the packaging of user data within an DSL frame. The packaging may include multiplexing, de-multiplexing, and timing alignment of multiple user data channels.

The DSL frame is a set of data bits set in a particular order. Some portions of the frame are used to transmit user data, some portions are used for transmission of management information, and some portions are used to define separate sections for various features. Of particular interest to the interleaved generalized convolutional encoder, some portions of the DSL frame are used to transport the coefficient variables used by the convolutional encoder. The use of the coefficient variables will be described below.

The transmitter physical media specific layer 116 handles framing, frame synchronization and scrambling. The output of the physical media specific layer is a scrambled serial stream of bits (in bit time). The transmitter physical media dependent layer 118 is responsible for symbol timing, coding, modulation, and other functions.

Figure 2:
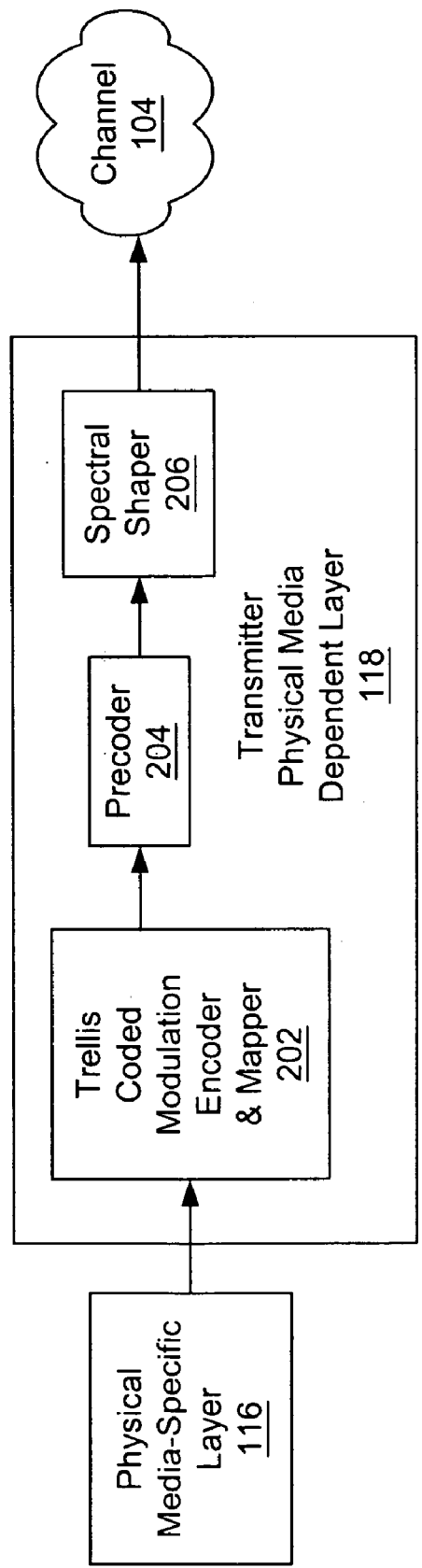
FIG. 2 is block diagram of the physical media dependent layer of the transmitter of the DSL transmission system of FIG. 1 including a Trellis Coded Modulation (TCM) encoder and mapper.
Figure 3:
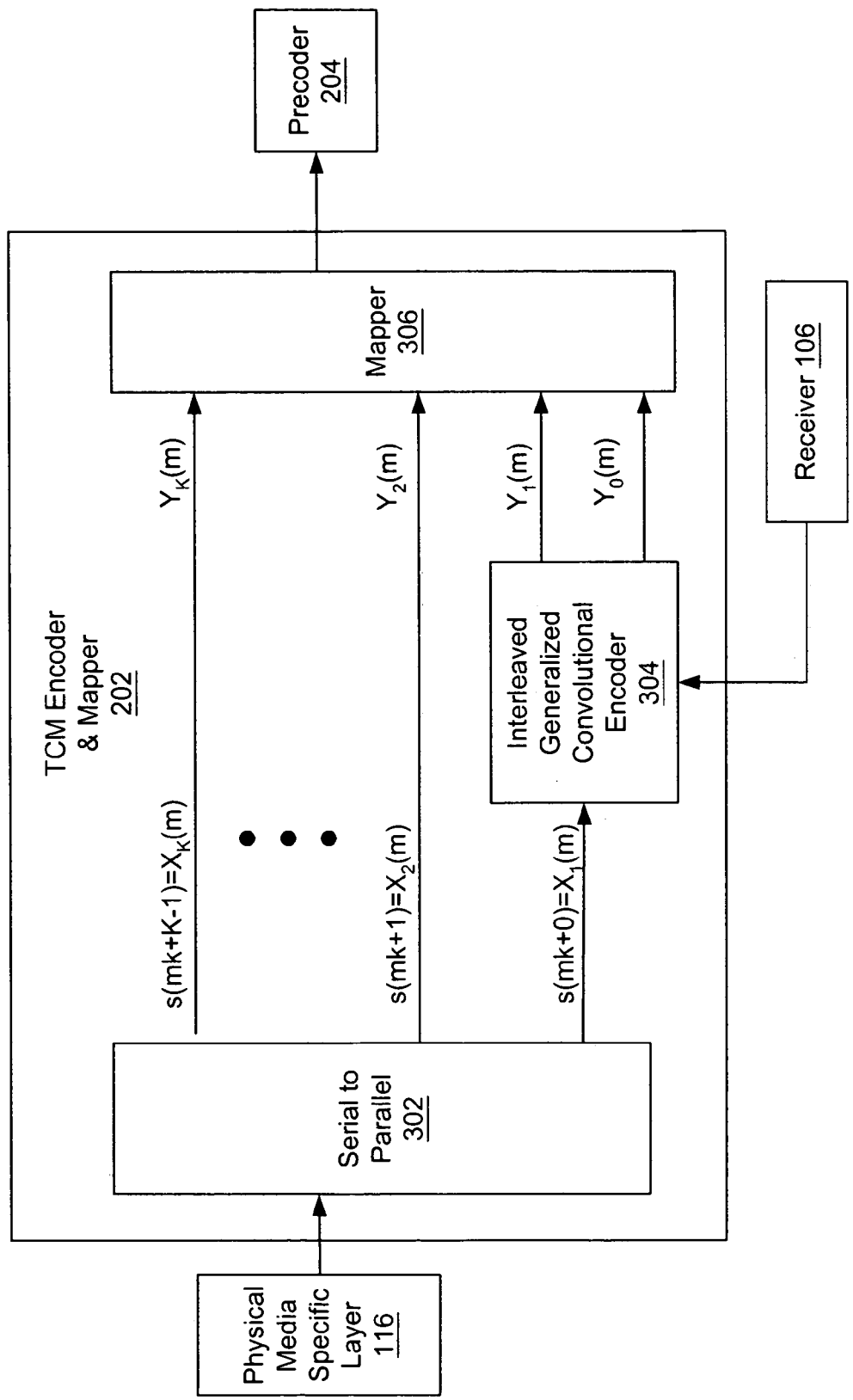
FIG. 3 is a block diagram of the TCM encoder and mapper of the transmitter physical media dependent layer of FIG. 2 including an interleaved generalized convolutional encoder.

FIG. 2 is block diagram of the physical media dependent layer 118 of the transmitter 102 of the DSL transmission system 100 of FIG. 1 including a Trellis Coded Modulation (TCM) encoder and mapper 202. The physical media dependent layer 118 receives input from the physical media specific layer 116. The physical media dependent layer 118 includes the TCM encoder and mapper 202, a precoder 204, and a spectral shaper 206. The TCM encoder and mapper 202 are shown in FIG. 3 and are discussed below. The TCM encoder and mapper 202 receives the framed and scrambled serial stream of bits from the physical media specific layer 116. The output of the TCM encoder and mapper 202 is a convolutionally encoded and mapped stream of symbols (in symbol time). The precoder 204 accepts the encoded and mapped data from the TCM encoder and mapper 204 and precodes the symbols based on precoder coefficients transferred to the precoder 204 by the receiver 106. The spectral shaper 206 shapes the data symbols and passes them to the channel 104.

FIG. 3 is a block diagram of the TCM encoder and mapper 202 of the transmitter 102 physical media dependent layer 118 of FIG. 2 including an interleaved generalized convolutional encoder 304. A serial to parallel converter 302 accepts the framed and scrambled serial stream of bits from the physical media specific layer 116 and converts the stream into a K-bit parallel word at the $m^{th}$ symbol time $\{X_1(m)=s(mk+0), X_2(m)=s(mk+1), \ldots, X_K(m)=s(mk+K-1)\}$. For each baud, an interleaved generalized convolutional encoder 304 receives one bit ($X_1(m)$), from the DTE input through the serial to parallel converter 302 and encodes the bit in a manner detailed below and illustrated in FIG. 5. The interleaved generalized convolutional encoder 304 also receives input from the receiver 106. The input from the receiver 106 includes the activation frame format, discussed below and shown in FIG. 8, and convolutional variables, discussed below and shown in FIG. 5.

The interleaved generalized convolutional encoder 304 produces a two-bit output ($Y_0(m)$ and $Y_1(m)$). A mapper 306 accepts the two bit output from the interleaved generalized convolutional encoder 304 and additional outputs directly from the serial to parallel converter 302 ($Y_2(m)=X_2(m), \ldots, Y_k(m)=X_k(m)$). The mapper 306 maps to level, $Y(m)$, in a manner that is well known in the art. The precoder 204 accepts the encoded and mapped data from the mapper 306.

Figure 4:
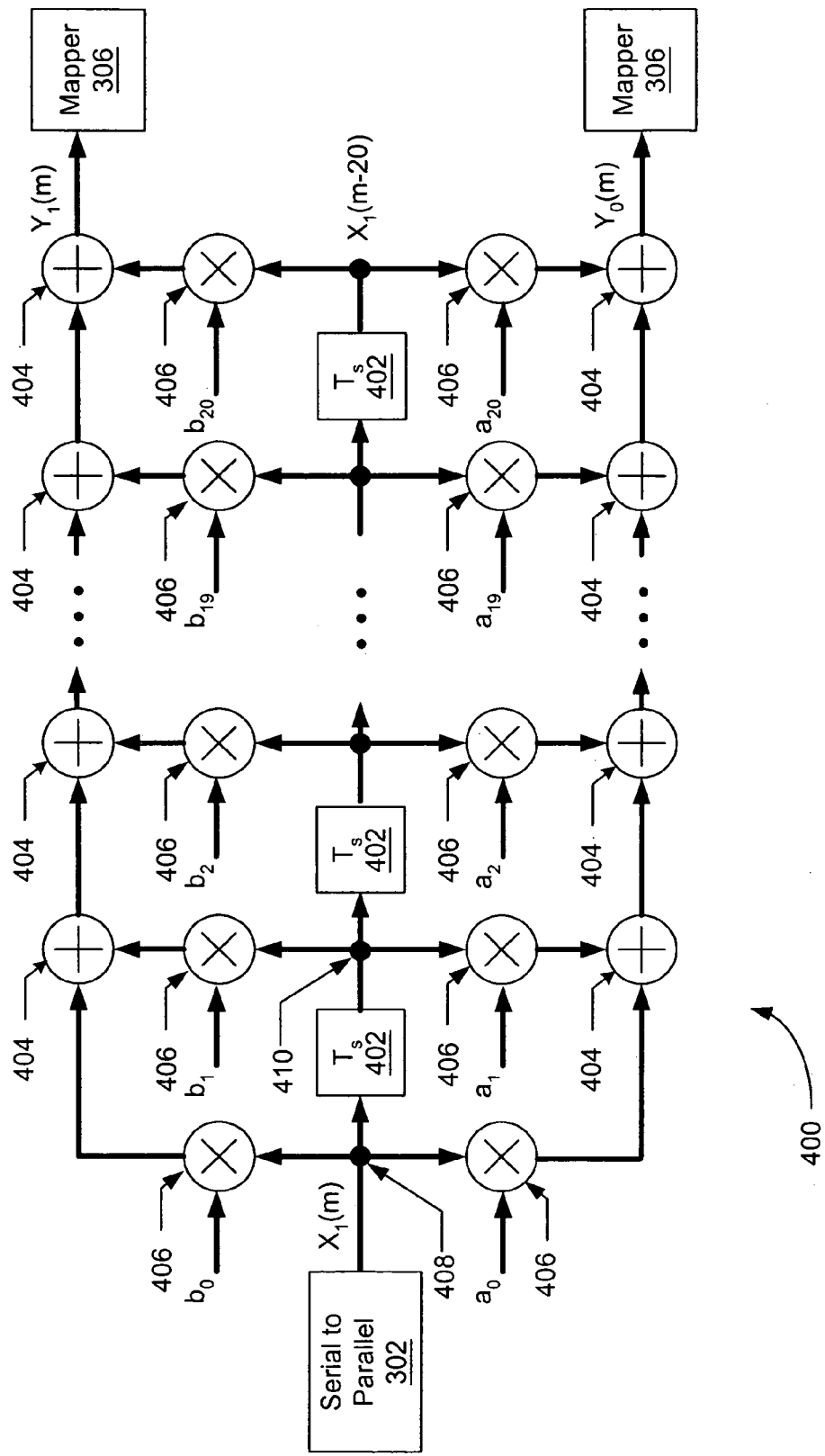
FIG. 4 is a block diagram of a prior art convolutional encoder.

FIG. 4 is a block diagram of a prior art convolutional encoder 400. The interleaved generalized convolutional encoder 304 replaces the prior art convolutional encoder 400 in the DSL transmitter 100. The prior art convolutional encoder 400 is a feed-forward non-systematic convolutional encoder, where $T_s$ 402 is a delay of one symbol time, and where $T_s$ 402 includes a memory element for storing the delayed prior inputs. The prior art convolutional encoder 400 includes binary exclusive-OR gates 404 and binary AND gates 406. One bit, $X_1(m)$, is introduced into the prior art convolutional encoder 400 at the first node 408. Binary coefficients $a_i$ and $b_i$ are introduced to the prior art convolutional encoder 400 from the receiver 106 during an activation phase. A numerical representation of the coefficients is A and B where:

$$A=a_{20}\cdot 2^{20}+a_{19}\cdot 2^{19}+a_{18}\cdot 2^{18}+ \ldots +a_0\cdot 2^0; \text{ and}$$

$$B=b_{20}\cdot 2^{20}+b_{19}\cdot 2^{19}+b_{18}\cdot 2^{18}+ \ldots +b_0\cdot 2^0.$$

The receiver sends "$a_0$" first in time followed by $a_1, a_2, \ldots,$ and $b_{20}$ is sent last in time in the activation frame. The prior art convolutional encoder 400 calculates the two bit output, designated $Y_0(m)$ and $Y_1(m)$, based on $X_1(m)$, A, B, and the prior inputs from the serial to parallel converter 302. The two bit output, $Y_0(m)$ and $Y_1(m)$, is passed on to the mapper 306. After a delay of one symbol time, designated $T_s$ 402, $X_1(m)$ is passed on to node two 410 and is then designated $X_1(m-1)$. The prior art convolutional encoder 400 is well known in the art.

Figure 5:
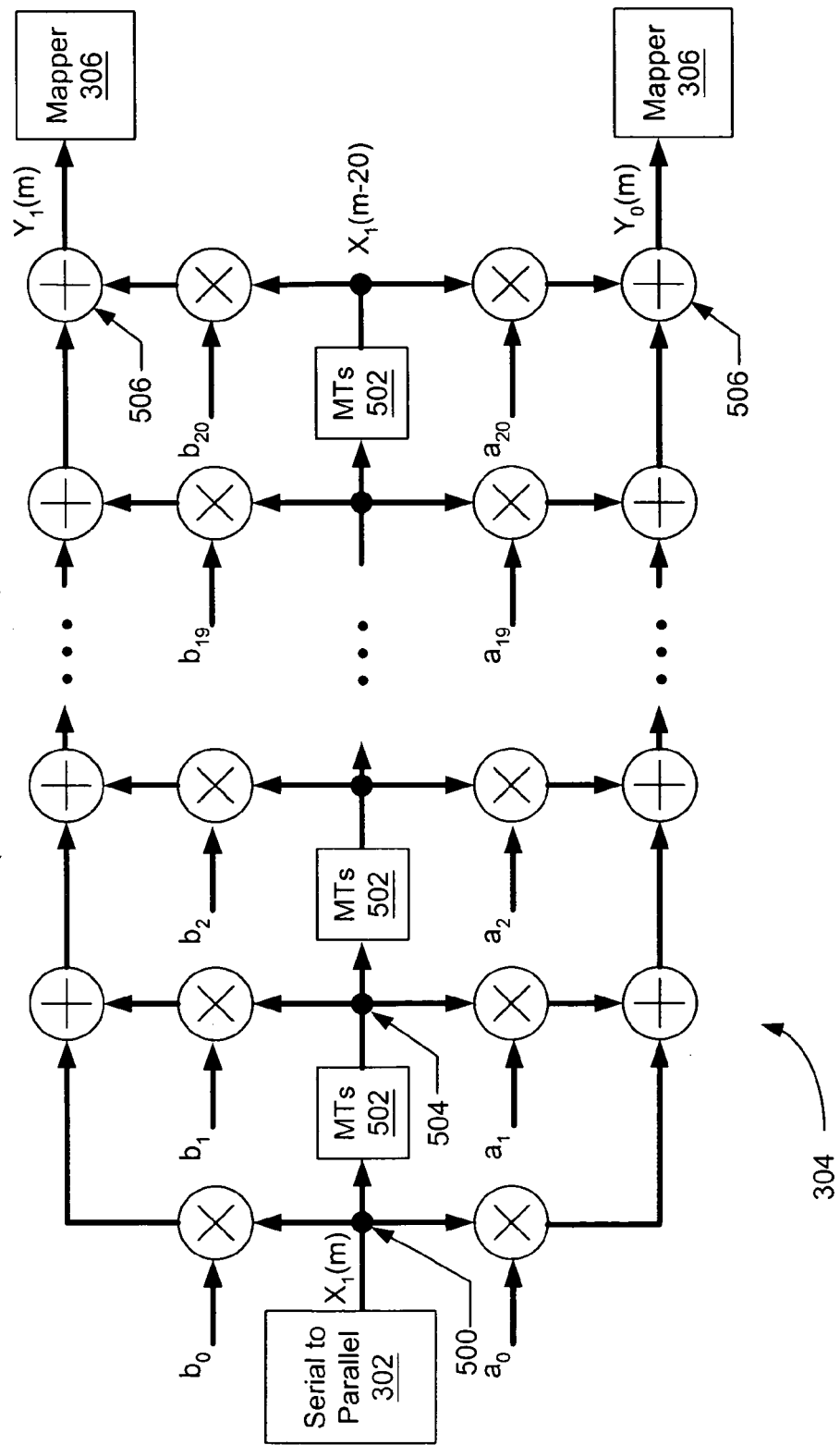
FIG. 5 is a block diagram of the interleaved generalized convolutional encoder of the TCM encoder and mapper of FIG. 3 including a variable unit time delay.

FIG. 5 is a block diagram of the interleaved generalized convolutional encoder 304 of the TCM encoder and mapper 202 of FIG. 3 including a variable unit time delay 502 element. With the exception of differences pointed out below, the operation of the interleaved generalized convolutional encoder 304 is the same as the prior art convolutional encoder 400 illustrated in FIG. 4. A data input, one bit $X_1(m)$, from a signal originating at the data terminal equipment 108 input, is introduced into the interleaved generalized convolutional encoder 304 at the first node 500 from the serial to parallel converter 302. The interleaved generalized convolutional encoder 304 calculates a two bit output, designated $Y_0(m)$ and $Y_1(m)$, based on $X_1(m)$, A, B, and prior inputs from the serial to parallel converter 302. The two bit output is the result of the final logic calculators 506. The final logic calculators are shown as exclusive –OR gates in FIG. 5. Instead of a delay of one symbol time 402, the interleaved generalized convolutional encoder 304 includes a variable unit time delay $MT_s$ 502 element where M is a variable integer of one or more, and where the variable unit time delay $MT_s$ 502 element includes a memory element for storing the delayed prior inputs. This substitution interleaves symbols over a time span of M symbol periods. After a variable unit time delay $MT_s$ 502, $X_1(m)$ is passed on to node two 504 and is then designated $X_1(m-1)$. Although FIG. 5 shows a twenty-one (21) symbol interleaved generalized convolutional encoder, the invention may be practiced with an encoder with more or less than twenty-one (21) symbols.

Those skilled in the art will recognize modifications and variations of the structures and arrangements for processing the two bit output based on the interleaved generalized convolutional encoder 304 shown in FIG. 5. The alternatives include rearranging the order of the logic gates so that the two bit output is produced by a binary AND gate or other components that do not change the spirit of the invention. All such modifications and variations are intended to be included herein within the scope of this disclosure and the present invention and protected by the claims below.

Figure 6:
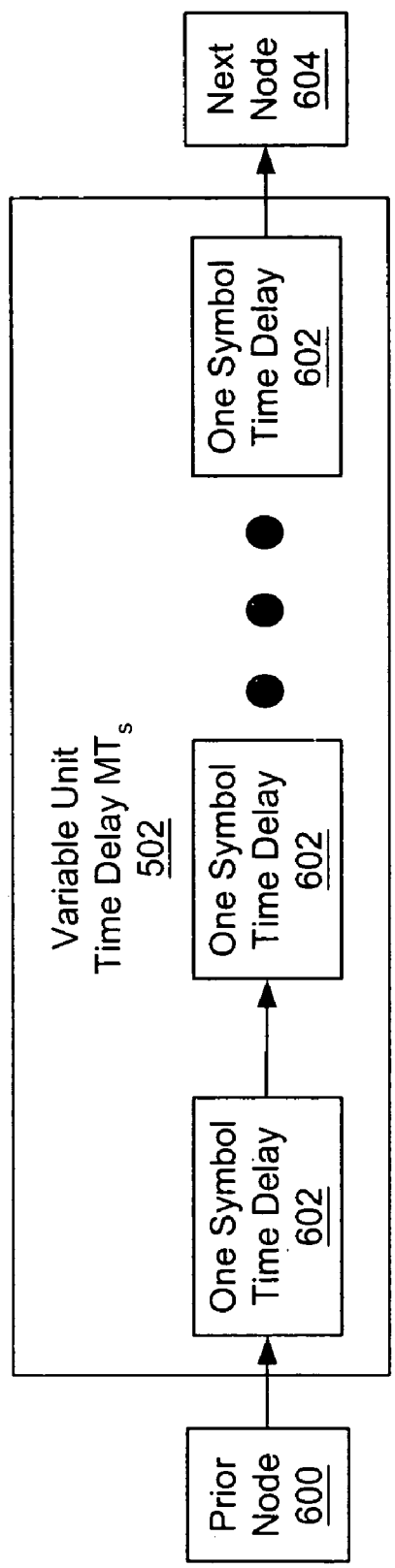
FIG. 6 is a block diagram of the variable unit time delay of the interleaved generalized convolutional encoder of FIG. 5.

FIG. 6 is a block diagram of the variable unit time delay 502 of the interleaved generalized convolutional encoder 304 of FIG. 5. The variable unit time delay $MT_s$ 502 receives one bit from the previous node 600, for example first node 500. The variable unit time delay $MT_s$ 502 then imposes a variable number of one symbol time delays $T_s$ 602. The variable unit time delay $MT_s$ 502 then passes the bit to the next node 604, for example second node 504.

FIG. 7 is a table showing a prior art activation frame format for conveying parameters for the prior art convolutional encoder 400 of FIG. 4. As is known in the art, an activation frame format conveys parameters from the receiver 106 to the transmitter 102. The parameters conveyed by the prior art activation frame format assume the parameters designating a unit time delay 402.

FIG. 8 is a table showing an interleaved generalized convolutional encoder activation frame format for conveying the parameters associated with the variable unit time delay 502 of FIG. 6. The interleaved generalized convolutional encoder activation frame format conveys the parameter M to the transmitter 102. It is also necessary to add a negotiation parameter to pre-activation to indicate the highest value of M supported by the transmitter 102. In the first embodiment, a negotiation parameter of one (1) is mandatory and other values are optional. The addition of a negotiation parameter is well known to those skilled in the art.

The interleaved generalized convolutional encoder 304 may be employed in a dynamically selectable manner by varying the number of delay elements used based on the condition of the transmission path. In one automatic dynamic mode, the transmitter 102 would inform the receiver 106 of the maximum number of delay units the transmitter 102 can implement based on the memory capacity of the transmitter 102. The receiver 106 would then instruct the transmitter to increase the number of delay elements, up to the maximum, when increased noise degrades the transmission path.

Although the variable unit time delay $MT_s$ 502 is not limited to a certain number, it is anticipate that three unit time delays will often be employed. The maximum number of delay units may be limited by the particular application. When operating in a dynamically selectable manner with a maximum number of unit delays, the transmitter and receiver will communicate regarding the maximum number of delay units the system is capable of employing. This information may be communicated during the "hand shaking" routine. The particulars of the hand-shaking routine are well known to those skilled in the art.

II. SECOND EMBODIMENT OF THE INTERLEAVED GENERALIZED CONVOLUTIONAL ENCODER

The interleaved generalized convolutional encoder can also be implemented by inserting a variable time delay and a switch before a plurality of prior art convolutional encoders. In the second embodiment, the $X_1(m)$ bit from the serial-to-parallel converter 302 is sent to a first prior art convolutional encoder 400, and the next $X_1(m+1)$ bit from the serial-to-parallel converter 302 is sent to a second prior art convolutional encoder 400. This pattern is continued for a number of $X_1(m)$ bits, i.e. symbol times, equal to the variable time delay. After a variable time delay equal to the number of symbol times M, the next $X_1(m+M)$ bit is sent to the first prior art convolutional encoder.

III. THIRD EMBODIMENT OF THE INTERLEAVED GENERALIZED CONVOLUTIONAL ENCODER

The prior art convolutional encoder 400 is defined by twenty-one (21) coefficients in the ITU (International Telecommunication Union) draft specification titled "G.991.2 (ex G.shdsl)—Single-Pair High Speed Digital Subscriber Line (SHDSL) Transceivers" (G.991.2). If less than half of the coefficients are used, then a second interleaved convolutional encoder can be implemented by inserting M zero coefficients between every coefficient of the original single encoder.

In an HDSL2 transceiver unit, such as that described in G.991.2, a reference code of A=556 octal and B=1461 octal is employed. This is converted into two interleaved convolutional encoders using reference code A=212124 octal and B=1202401 octal.

IV. FIRST EMBODIMENT OF THE GENERALIZED CONVOLUTIONAL DE-INTERLEAVER AND DECODER

Returning to FIG. 1, the receiver 106 includes complementary components to the transmitter 102. The complementary components include the receiver physical media dependent layer 120, the receiver physical media specific layer 124, the receiver transmission protocol specific layer 122, and the interface 126. The function, structure, and fabrication of the receiver 106 to complement the function, structure and fabrication of the transmitter 102 is well known to those skilled in the art. The application interface(s) 110 is also well known in the art. The physical media dependent layer 120 functions of the receiver 106 include symbol timing recovery, demodulation, echo cancellation, line equalization, and link startup.

FIG. 9 is block diagram of the physical media dependent layer 120 of the receiver 106 of the DSL transmission system 100 of FIG. 1 including a TCM decoder and demapper 906. The receiver physical media dependent layer 120 receives input from the channel 104. The channel 104 input is processed by an analog to digital converter (ADC) and a forward equalizer 902. The signal is also processed by an echo canceller that is not shown and may be filtered to reject unwanted signals by a filter that is also not shown. The converted and equalized signal is passed to a noise whitening filter 904. The noise whitening filter 904 deprocesses the signal in a manner inverse to the function of the precoder 204. The functions of the noise whitening filter 904 may also be incorporated into forward equalizer 902 if changes in the precoder 204 coefficients are not expected. The signal is then passed from the noise whitening filter 904 to the TCM decoder and demapper 906. The TCM decoder and demapper 906 passes on a serial data stream to the receiver physical media dependent layer 124.

Figure 10:
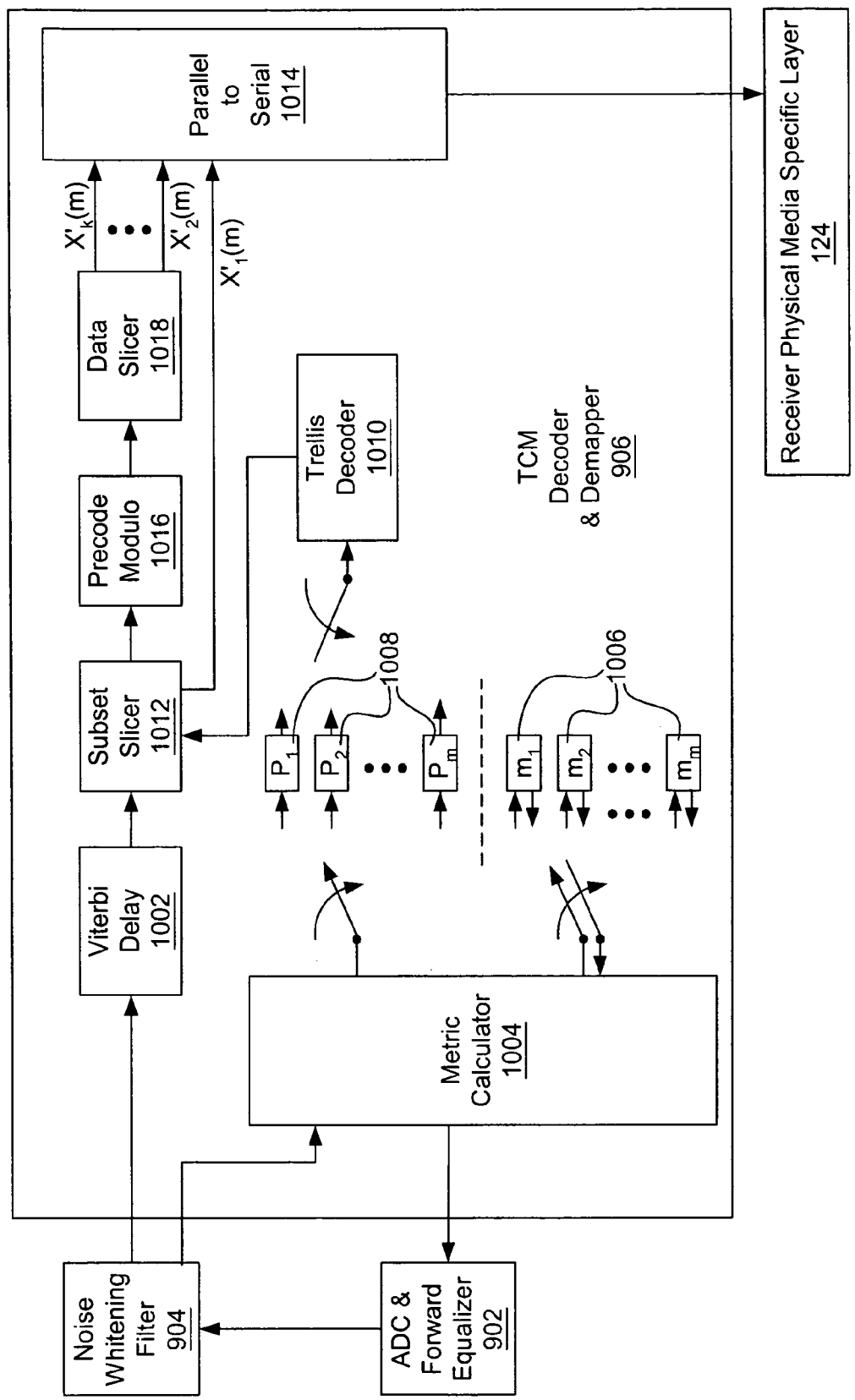
FIG. 10 is a block diagram of the TCM decoder and demapper of the receiver physical media dependent layer of FIG. 9.

FIG. 10 is a block diagram of the TCM decoder and demapper 906 of the receiver physical media dependent layer 120 of FIG. 9. In the TCM decoder and demapper 906, the output of the noise whitening filter 904 is passed to a viterbi delay 1002 and a metric calculator 1004. The output of the noise whitening filter 904 sent to the viterbi delay 1002 is the preliminary received symbol. The output of the noise whitening filter 904 sent to the metric calculator 1004 is the calculated received symbol. Ideally, the preliminary received symbol and the calculated received symbol are the same. If the channel has been affected by noise, the TCM decoder and demapper 906 calculates the most likely symbol actually sent based, in part, on previously sent symbols. The viterbi delay 1002 delays the preliminary received symbol while the calculated received symbol is determined by the TCM decoder and demapper 906. The viterbi delay 1002 implements a variable delay of M where M is the variable integer used by the variable unit time delay $MT_s$ 502 in the transmitter 102.

The metric calculator 1004 requires a delay in the processing of the calculated received symbols by M times the delay associated with the prior art decoder. In FIG. 10, the delay in the processing of the calculated received symbols is shown by variable delay metric memories 1006. In the metric calculator 1004, metrics are calculated on the current symbol "i" by comparing received signal to path metrics $m_i$ after requesting all previous states associated with i. After the metric calculator 1004 calculates new metrics $m_i$, the variable delay metric memory 1006 element associated with symbol i, is updated to reflect the new metrics $m_i$.

After calculating metrics associated with a received symbol, the metric calculator 1004 updates path memories 1008. In particular, after the metric calculator 1004 calculates new metrics $m_1$, path memory $P_1$ is updated to point to the best previous state corresponding to the respective metric $m_1$. In the TCM decoder 1010, a viterbi algorithm looks back through the previous path memory $P_i$ to determine the most likely actual symbol sent and thus determines the final state and the decoded databit $X'_1(m)$. The viterbi algorithm is known to those skilled in the art.

The output of the viterbi delay 1002 is passed to a subset slicer 1012. The subset slicer 1012, with input from the TCM decoder 1010 produces an ideal reference of the transmit mapper x'(m). The decoded databit $X'_1(m)$ is then sent to a parallel to serial converter 1014 or the decoded databit $X'_1(m)$ may be sent directly to the parallel to serial converter 1014 by the Trellis decoder 1010.

The output from the subset slicer 1012 is then processed by the Tomlinson precoder modulo 1016 to reproduce x'(m). The output of the precoder modulo 1016 is then processed by the data slicer 1018 to produce the final decoded bits $X'_2(m), X'_3(m), \ldots X'_k(m)$. In the parallel to serial converter 1014, the final decoded bits $X'_2(m), X'_3(m), \ldots X'_k(m)$ are combined with $X'_1(m)$ to generate a decoded serial bit stream. The decoded serial bit stream is then passed on to the receiver physical media specific layer 124.

V. SECOND EMBODIMENT OF THE GENERALIZED CONVOLUTIONAL DE-INTERLEAVER AND DECODER

The generalized convolutional de-interleaver and decoder may also be implemented by associating a switching system with M prior art decoders. The M prior art decoders are selected sequentially with a new prior art decoder selected for each symbol pulse. For example, decoder i is selected for symbols i, i+M, i+2M, . . . . A decoder similar to the second embodiment of the generalized convolutional de-interleaver and decoder is shown in U.S. Pat. No. 4,677,625 to Betts, et al.

VI. THIRD EMBODIMENT OF THE GENERALIZED CONVOLUTIONAL DE-INTERLEAVER AND DECODER

The generalized convolutional de-interleaver and decoder may also be implemented by associating a switching system with one prior art decoder (a subdecoder) associated with M symbol memory elements. The M symbol memories are selected sequentially with a new memory element selected for each symbol pulse. For example, memory i is selected for symbols i, i+M, i+2M . . . . If implemented in hardware, the symbol memories can be simple shift registers with M stages.

VII. ADDITIONAL EMBODIMENTS

It should be emphasized that the above-described embodiments of the present invention, particularly, any first, second and third embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

Therefore, having thus described the invention, at least the following is claimed:

1. An interleaved generalized convolutional encoder in a transmitter, the encoder configured to receive a stream of input symbols and to produce an interleaved and convolutionally encoded stream of output symbols, the encoder comprising:

a series of delay elements each having a delay of M symbol periods, where M is greater than one and is configurable at run-time, the first delay element receiving as input the current symbol from the input stream, each of the remaining delay elements receiving as input the delayed symbol as output from the prior delay element;

a plurality of taps, each tap disposed at the output of one of the delay elements;

a first multiplier disposed at the input stream and multiplying the current symbol by a first coefficient;

a series of second multipliers, each second multiplier coupled to one of the taps and multiplying the delayed symbol by one of a plurality of second coefficients; and a series of adders, the first adder receiving multiplied data from the first multiplier and the first in the series of second multipliers, each of the remaining adders receiving multiplied data from a current and a previous multiplier in the series of second multipliers, each adder adding the received data to produce an intermediate symbol, wherein the intermediate symbol produced by the last adder is an interleaved convolutionally encoded symbol in the output stream.

2. The encoder of claim 1, wherein the delay M is determined based on the quality of a transmission path between the transmitter and a receiver in communication with the transmitter.

3. The encoder of claim 1, wherein the delay M is determined based on noise affecting the transmission of data between he transmitter and a receiver in communication with the transmitter.

4. The encoder of claim 1, wherein the delay M is dynamically determined by a receiver in communication with the transmitter.

5. The encoder of claim 4, wherein the delay M is determined based on the quality of a transmission path between the transmitter and the receiver.

6. The encoder of claim 4, wherein the delay M is determined based on noise affecting the transmission of data between he transmitter and the receiver in communication.

7. The encoder of claim 1, wherein the delay element comprises a plurality of unit time delays.

8. The encoder of claim 1, wherein series of adders comprises a plurality of binary exclusive-OR gates.

9. The encoder of claim 1, wherein the series of adders is implemented with firmware.

10. The encoder of claim 1, wherein the encoder is implemented with software that is executed by a processor.

11. The encoder of claim 1, where M has the same first value for successive symbols in the input stream unless reconfigured to a second value.

12. A modem that includes the encoder of claim 1.

13. An interleaved generalized convolutional encoder in a transmitter, the encoder configured to receive a stream of input symbols and to produce an interleaved and convolutionally encoded stream of output symbols, the encoder comprising:
  a plurality of delay means, each having a delay of M symbol periods, where M is greater than one and is configurable at run-time,
    the first delay means receiving as input the current symbol from the input stream,
    each of the remaining delay means receiving as input the delayed symbol as output from the prior delay element;
  a plurality of taps, each tap disposed at the output of one of the delay elements;
  a multiplying means comprising
    first logic for multiplying the current symbol in the input stream by a first coefficient; and
    second logic for multiplying each of the delayed symbols produced by the delay elements by a second coefficient, the second coefficient associated with the corresponding delay element; and
  a series of adders, the first adder receiving multiplied data from the first multiplier and the first in the series of second multipliers, each of the remaining adders receiving multiplied data from a current and a previous multiplier in the series of second multipliers, each adder adding the received data to produce an intermediate symbol,
    wherein the intermediate symbol produced by the last adder is an interleaved convolutionally encoded symbol in the output stream.

14. The encoder of claim 13, wherein the delay M is determined based on the quality of a transmission path between the transmitter and a receiver in communication with the transmitter.

15. The encoder of claim 13, wherein the delay M is determined based on noise affecting the transmission of data between he transmitter and a receiver in communication with the transmitter.

16. The encoder of claim 13, wherein the delay M is dynamically determined by a receiver in communication with the transmitter.

17. The encoder of claim 16, wherein the delay M is determined based on the quality of a transmission path between the transmitter and the receiver.

18. The encoder of claim 16, wherein the delay M is determined based on noise affecting the transmission of data between he transmitter and the receiver in communication.

19. The encoder of claim 13, wherein the delay element comprises a plurality of unit time delays.

20. The encoder of claim 13, wherein series of adders comprises a plurality of binary exclusive-OR gates.

21. The encoder of claim 13, wherein the series of adders is implemented with firmware.

22. The encoder of claim 13, wherein the encoder is implemented with software that is executed by a processor.

23. The encoder of claim 13, where M has the same first value for successive symbols in the input stream unless reconfigured to a second value.

24. A modem that includes the encoder of claim 13.

* * * * *

UNITED STATES PATENT AND TRADEMARK OFFICE
CERTIFICATE OF CORRECTION

| | | |
|---|---|---|
| PATENT NO. | : 7,055,088 B2 | Page 1 of 1 |
| APPLICATION NO. | : 09/777213 | |
| DATED | : May 30, 2006 | |
| INVENTOR(S) | : Betts | |

It is certified that error appears in the above-identified patent and that said Letters Patent is hereby corrected as shown below:

Column 2, Line 65, "date" should be deleted and --data-- inserted

Column 12, Claim 3, Line 3, "he" should be deleted and --the-- inserted

Column 12, Claim 6, Line 3, "he" should be deleted and --the-- inserted

Column 13, Claim 8, Line 1, the word --the-- should be inserted before the word "series"

Column 14, Claim 15, Line 3, "he" should be deleted and --the-- inserted

Column 14, Claim 18, Line 3, "he" should be deleted and --the-- inserted

Signed and Sealed this

Twenty-sixth Day of September, 2006

JON W. DUDAS
*Director of the United States Patent and Trademark Office*